US006573843B1

(12) United States Patent
Murphy

(10) Patent No.: US 6,573,843 B1
(45) Date of Patent: Jun. 3, 2003

(54) SNAP-ON KEYBOARD AND METHOD OF INTEGRATING KEYBOARD

(75) Inventor: Stephen C. Murphy, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/353,168

(22) Filed: Jul. 14, 1999

(51) Int. Cl.$^{7}$ .............................................. H03K 17/94

(52) U.S. Cl. .......................... 341/22; 345/173; 361/681

(58) Field of Search .......................... 341/22; 345/173; 361/680, 681

(56) References Cited

U.S. PATENT DOCUMENTS

| | | | | | |
|---|---|---|---|---|---|
| 3,940,758 | A | | 2/1976 | Margolin | 340/337 |
| 4,333,155 | A | | 6/1982 | Johnston | 364/708 |
| 4,378,553 | A | | 3/1983 | McCall | 340/365 R |
| 4,509,873 | A | | 4/1985 | Ryan | 400/489 |
| 4,517,660 | A | | 5/1985 | Fushimoto et al. | 364/708 |
| 4,661,005 | A | | 4/1987 | Lahr | 400/489 |
| 4,739,451 | A | | 4/1988 | Kuba | 361/394 |
| 4,839,837 | A | | 6/1989 | Chang | 364/708 |
| 4,852,498 | A | | 8/1989 | Judd | 108/43 |
| D306,433 | S | | 3/1990 | Mitchell | D14/106 |
| 5,067,834 | A | | 11/1991 | Szmanda et al. | 400/489 |
| 5,073,050 | A | | 12/1991 | Andrews | 400/82 |
| 5,137,384 | A | | 8/1992 | Spencer et al. | 400/489 |
| 5,150,118 | A | | 9/1992 | Finkle et al. | 341/23 |
| 5,187,644 | A | | 2/1993 | Crisan | 361/393 |
| 5,189,543 | A | | 2/1993 | Lin et al. | 359/142 |
| 5,228,791 | A | | 7/1993 | Fort | 359/142 |
| 5,251,106 | A | | 10/1993 | Hui | 361/744 |
| 5,331,508 | A | | 7/1994 | Hosoi et al. | 361/680 |
| 5,336,002 | A | | 8/1994 | Russo | 400/489 |
| 5,410,333 | A | | 4/1995 | Conway | 345/169 |
| 5,440,502 | A | * | 8/1995 | Register | 345/179 |
| 5,457,453 | A | | 10/1995 | Chiu et al. | 341/22 |
| 5,490,036 | A | | 2/1996 | Lin et al. | |
| 5,502,460 | A | | 3/1996 | Bowen | 345/168 |
| 5,519,569 | A | | 5/1996 | Sellers | 361/680 |
| 5,539,615 | A | | 7/1996 | Sellers | |
| 5,644,338 | A | | 7/1997 | Bowen | 345/168 |
| 5,687,058 | A | | 11/1997 | Roylance | 361/680 |
| 5,726,684 | A | | 3/1998 | Blankenship et al. | 345/167 |
| 5,737,107 | A | | 4/1998 | Umeda | 359/146 |
| 5,774,329 | A | | 6/1998 | Kuo | 361/680 |
| 5,861,822 | A | | 1/1999 | Park et al. | 341/22 |
| 5,865,546 | A | | 2/1999 | Ganthier et al. | 400/489 |
| 5,926,364 | A | | 7/1999 | Karidis | 361/681 |
| 5,983,073 | A | | 11/1999 | Ditzik | 455/11.1 |
| 6,118,436 | A | * | 9/2000 | Kushita | 345/173 |

* cited by examiner

*Primary Examiner*—Timothy Edwards
(74) *Attorney, Agent, or Firm*—Knobbe Martens Olson & Bear LLP

(57) ABSTRACT

A snap-on keyboard configured to operate with a computer. The keyboard comprises a platform having a plurality of surfaces, and configured to house a plurality of components. The keyboard further comprises of a set of keys attached to one of the plurality of surfaces of the platform. The keyboard further comprises a connector attached to at least a portion of one of the plurality of surfaces of the platform. The connector is configured to automatically connect to a receiving connector attached to the computer in response to a force exerted downwardly from the platform to the computer.

12 Claims, 5 Drawing Sheets

SNAP-ON KEYBOARD AND METHOD OF INTEGRATING KEYBOARD

BACKGROUND OF THE INVENTION

1. Field of the Invention

The invention relates generally to peripheral devices used with a computer system, such as a personal computer. More particularly, this invention relates to easy-to-use keyboards that operate with portable computers.

2. Description of the Related Art

Compact or portable computers are becoming as common as conventional desktop computers. Portable computers come in a variety of designs and sizes and, most commonly, are configured to comprise lightweight computers that are small enough to be carried and fit easily in a limited space, such as a briefcase. As used herein, the term "portable computer" refers to, without limitation, all movable computers including laptop, notebook, subnotebook, hand-held, palm pilot, personal digital assistant (PDA), and other similar computing devices, but not including desktop computers.

Desktop computers are often designed with detachable input/output (I/O) devices such as monitors, keyboards, and mice. This allows users to configure the desktop computer to include the desirable quality and position of I/O devices in a most ergonomic manner. For example, full size keyboards are typically attached to desktop computer via a long cable.

In contrast with the ergonomic advantages of desktop computers, portable computers are typically designed with I/O devices physically and electrically attached within the casing of the computer. For example, the screen of a portable computer is often encased within the lid of the portable computer, which swings upward from the base via a hinged connector. Portable computer keyboards are relatively small and normally are awkwardly mounted within the base of the portable computer. The small size and awkward position of the portable computer keyboard causes frustration and reduces user productivity. In some cases, portable computer keyboards may cause repetitive wrist discomfort, pain, and injury.

To minimize the effect of these problems, some portable computers are designed with tiltable feet that swing out from underneath the base, thereby titling the keyboard toward the user. For further details on tilting the keyboard in a portable computer, reference is made to U.S. Pat. No. 5,490,036 issued to Lin et al. Other portable computers may be designed to be movable forwardly, away from the base of the computer in a sloped, tilted orientation. In this manner, the keyboard emulates the use orientation of a separate desktop computer keyboard. For further details on movable keyboards, reference is made to U.S. Pat. No. 5,539,615 issued to Sellers.

The solutions described in patent '036 and '615 attempt to improve the ergonomics and utility of portable computer keyboards. However, these attempts often fail to provide the comfort and size provided by a desktop keyboard. Some portable computers provide an auxiliary keyboard port located on one of their sides to connect a standard desktop keyboard to the portable computer using a keyboard cable. However, connecting a desktop keyboard to the side of the portable computer often reduces needed surface space on an often crowded desk or a person's lap. Some manufacturers make keyboard stands that suspend a standard desktop keyboard over the top of the base of the portable computer. However, elevating a standard desktop keyboard may not provide the required ergonomics to comfortably use the portable computer. More importantly, other buttons or controls on the base or touchpad become inaccessible or invisible to the user.

Therefore, there is a need in the computer industry to provide a keyboard that functions with portable computers without defeating portability, limited space usage, or accessibility and visibility of controls.

SUMMARY OF THE INVENTION

The invention comprises of a snap-on keyboard configured to operate with a computer. The keyboard comprises a platform having a plurality of surfaces, and configured to house a plurality of components. The components convert mechanical signals into electrical signals to the computer. The keyboard further comprises a set of keys attached to one of the plurality of surfaces of the platform. The set of keys are configured to provide input signals to the computer, the input signals being responsive to a mechanical force. The keyboard further comprises a connector attached to at least a portion of one of the plurality of surfaces of the platform. The connector is configured to automatically connect to a receiving connector attached to the computer in response to a force exerted from the platform towards the computer.

An alternative embodiment of the invention comprises a computer system having a base that includes a plurality of surfaces. The computer system further comprises a detachable snap-on keyboard configured to snap onto one of the plurality of surfaces of the base in response to a force exerted downwardly from the keyboard to the base. Wherein the keyboard includes a connector that is geometrically aligned with a receiving connector, which is attached to the base.

A further embodiment of the invention comprises a portable computer having a base with a plurality of surfaces. This embodiment of the portable computer comprises a lid secured to a rear portion of the base. The lid is moveable relative to the base between a closed position and an open position. The portable computer further comprises a connector attached to one of the plurality of surfaces. The connector is geometrically configured to align with and connect to a receiving connector that is attached to a detachable keyboard.

BRIEF DESCRIPTION OF THE DRAWINGS

The above and other aspects, features and advantages of the invention will be better understood by referring to the following detailed description, which should be read in conjunction with the accompanying drawings, in which.

DETAILED DESCRIPTION OF THE INVENTION

The following description is not to be taken in a limiting sense, but is made merely for the purpose of describing the general principles of the invention. The scope of the invention should be determined with reference to the claims.

Figure 1:
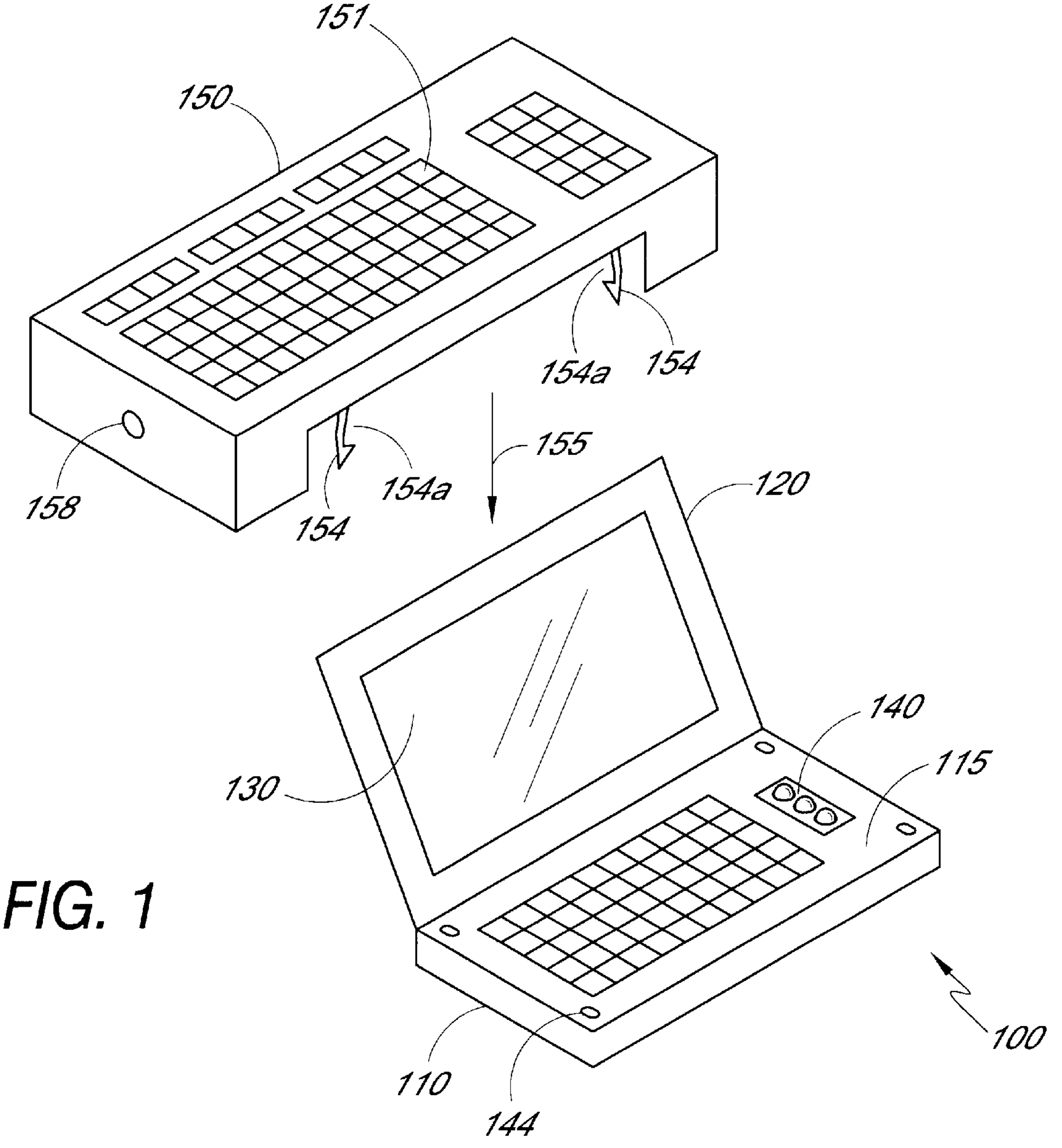
FIG. 1 is a perspective view of a portable computer and a keyboard in a separated or undocked position.

FIG. 1 is a perspective view of a portable computer and a keyboard in a separated or undocked position. As noted above, the portable computer 100 may, among other products, be a notebook, subnotebook, hand-held, palm pilot, or PDA computer. The portable computer 100 comprises a base 110 connected to a lid 120 using one or more connector hinges (not shown in this figure). If operation of the computer 100 is desired, the lid 120 is folded outwardly away from the base 110 to an open position, as shown in this figure. If the computer 100 is to be shut down or stowed away, the lid 120 is folded inwardly toward the base 110 to a closed position (not shown in this figure). In portable computers, the lid 120 often includes the monitor or screen 130, which allows the user to operate and view various computer applications. In this embodiment, the computer 100 includes an auxiliary electrical connector 140 that, when connected to a keyboard, allows a user to control and enter data into the computer via a detachable keyboard 150.

The keyboard 150 comprises a platform containing a set of keys, such as a key 151, which serve as mechanical input devices which convert the mechanical actions into electronic signals as with a standard computer keyboard. The keyboard 150 may include any set of typewriter-like keys that allow a user to enter data into a computer. Typically, the keyboard 150 includes alphanumeric keys, punctuation keys, and special function keys. Although there is not a single standard computer keyboard, the most commonly used keyboard is the enhanced 101-key keyboard that conforms to a QWERTY keyboard layout. Other keyboards include the original PC keyboard (with 84 keys) and the AT keyboard (also with 84 keys). Any one of these keyboards, or those developed in the future, may be used in implementing the invention.

The keyboard 150 includes an electrical connector 440 (see FIG. 4) located on its bottom surface which is physically compatible for forming an electrical connection with the connector 140. As shown in FIG. 1, the connector 140 is positioned on the upper surface 115 of the base 110 to conveniently mate with the connector 440 of the keyboard 150. Accordingly, the connector 140 may, for example, be located in the upper right corner of the base 110 and be substantially aligned with the location of the connector 440. Alternatively, the connector 140 may be located on the front or side surfaces of the base 110; and consequently connector 440 will be placed in a position on the keyboard 150 that geometrically aligns with the location of the connector 140. The connectors 140 and 440 may be any kind of connector that electrically couples a keyboard with a computer, such as a Universal Serial Bus (USB) port, serial pin connector, etc. Alternatively, each of the connectors 140 and 440 includes one or more contact points which, when placed in contact with the contact points of the other connector, allow electronic signals to flow between the computer 100 and keyboard 150.

The keyboard 150 may include one or more latches 154 that can mechanically engage the keyboard 150 with the base 110 of the computer 100. In one embodiment each latch 154 mates with a recess 144 located on the upper surface of the base 110. Each latch 154 includes a locking surface 154a that can catch or latch with an edge or lip (not shown) within the recess 144. The lip allows the latch 154 to hook securely and to be released when a lateral force is applied to it. This form of connection will prevent shifting or wobbling of the keyboard 150 during use, which could result in discomfort of the user. The keyboard 150 preferably contains one or more release buttons 158 that are mechanically coupled to the latches to apply the necessary lateral force to release the latches allowing the keyboard 150 to be removed from the base 110.

In this embodiment, to dock the keyboard 150 onto the computer 100, the keyboard 150 is aligned over the base 110. The alignment of the keyboard 150 with the base 110 is proper when two conditions are satisfied. The first condition is the alignment of the connector 140 with the connector 440, so that when the keyboard is attached, electronic signals may flow between the keyboard 150 and the computer 100 via the connectors 140 and 440. The second condition is the physical alignment of the latches 154 with the recesses 144 on the upper surface of the base 110 so that, when the keyboard 150 is placed over the base 110, the latches 154 fit into the respective recesses 144 and the locking surfaces 154*a* of the latches connect with the respective lips of the recesses and secure the keyboard 150 into place. After alignment of the keyboard 150 over the base 110, the keyboard 150 is pushed toward the base 110, in the direction of the arrow 155, to lock the base 110 substantially underneath the keyboard 150.

Alternatively, the keyboard 150 may be releasably attached to the base 110 or a surface upon which the computer 100 rests with clamps, velcro, suction cups, weights, or other connecting mechanisms or arrangements commonly used in the industry to attach two panels together. These methods of attachment may be used individually or in conjunction.

Figure 2:
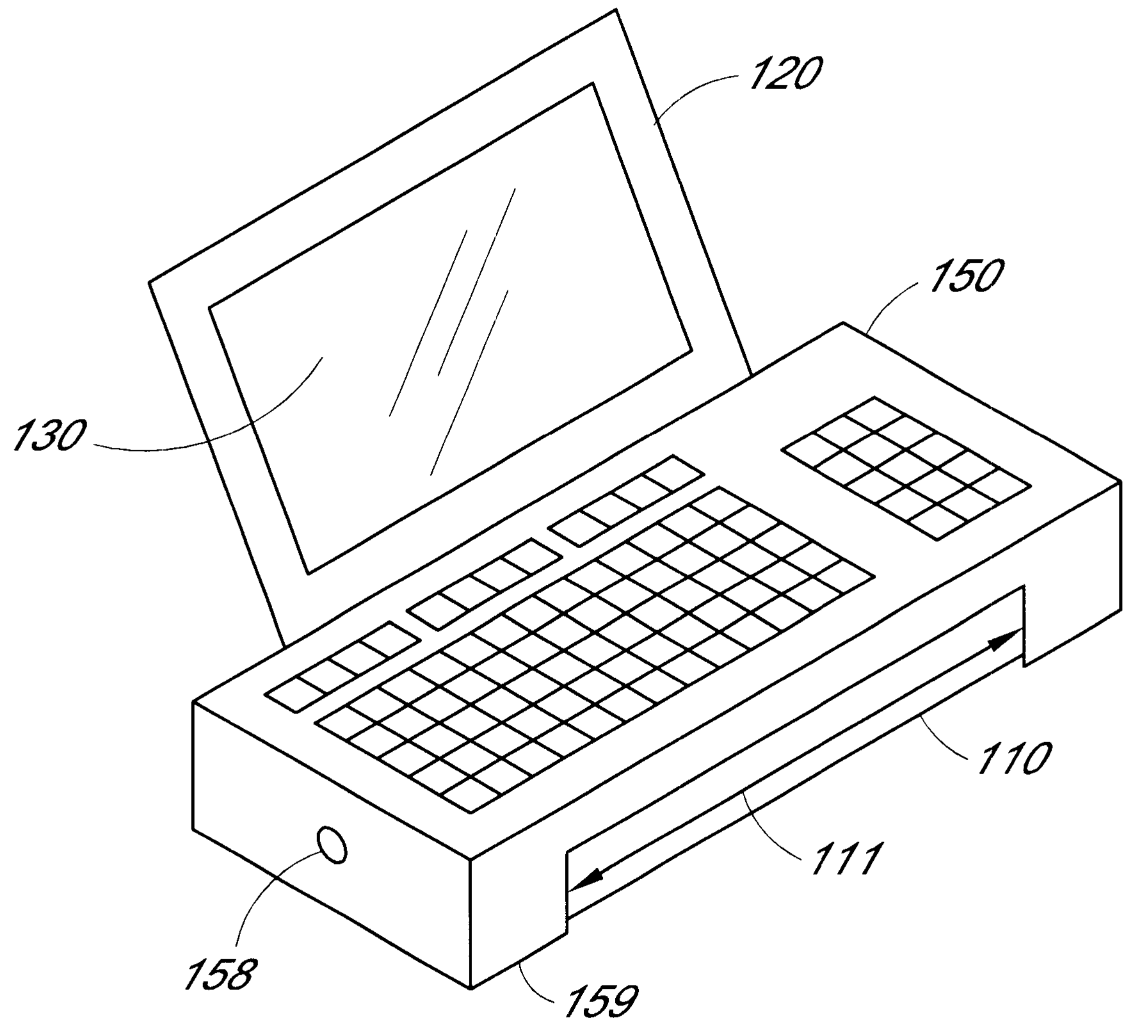
FIG. 2 is a perspective view of the portable computer and keyboard of FIG. 1 in a docked or engaged position in accordance with one embodiment of the invention.

FIG. 2 is a perspective view of the portable computer 100 and keyboard 150 of FIG. 1 in a docked or engaged position. It is desirable to have the lowest surface 159 of the keyboard 150 lie flush with a supporting surface, such as a desk top, to prevent tipping or wobbling during use. The base 110 may protrude past the opening 111 of the keyboard 150 (not shown in this figure) to allow for access to a touchpad or other input device located on the base. It is desirable that the keyboard 150 not rise to a level that obstructs a user's view of the screen 130. Snapping-on the keyboard 150 to the base 110 allows the laptop to provide the user with the comfort of a desktop computer while retaining the basic size and simplicity of a laptop. As used herein, the term "snap-on" or "snapping-on" refers to the mechanism of placing and securing the keyboard 150 onto a recipient device, such as a portable computer.

Figure 3:
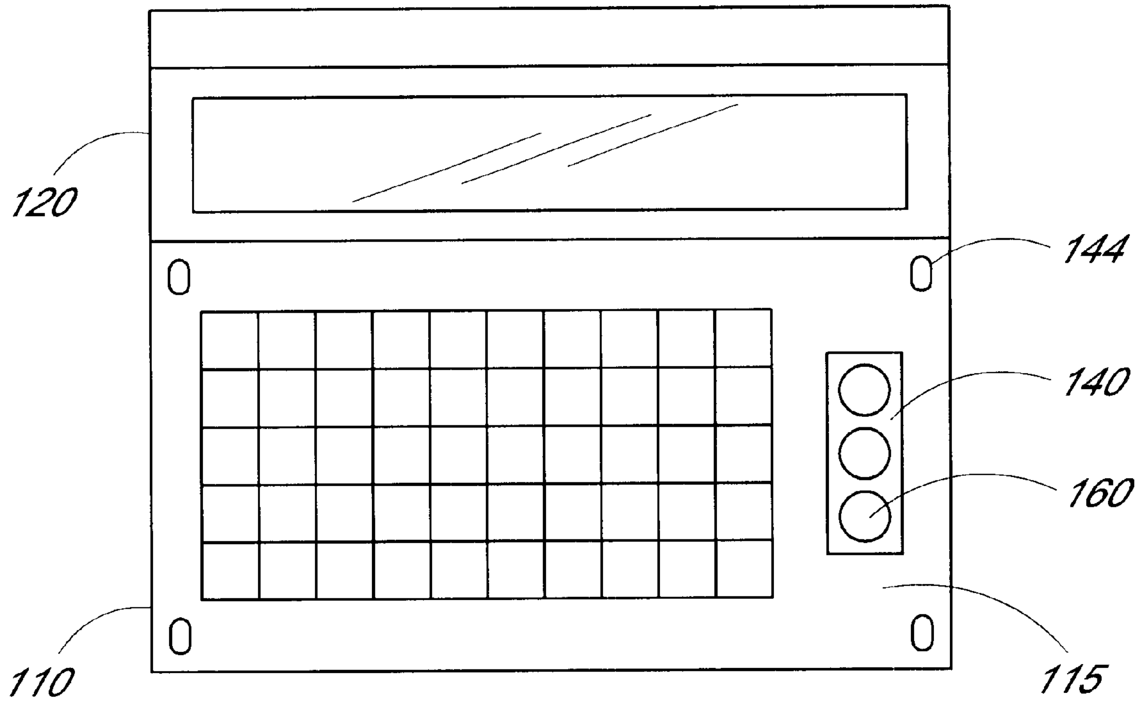
FIG. 3 is a top plan view of the base of the portable computer of FIG. 1.

FIG. 3 is a top plan view of the base 110 of the portable computer of FIG. 1. In this embodiment, the electrical connector 140 is positioned on the upper surface 115 of the base 110 to conveniently mate with the connector 440 which is located on the lower surface of the keyboard 150 (see FIG. 4). As noted above, the connector 140 may be placed on any surface of the base 110. The connector 140 may contain one or more spring mounted gold plated contact pins (shown in FIGS. 5 and 6). When the keyboard 150 is not connected, the pins protrude above the upper surface 115 of the base 110. The pins retract down into the base 110 when substantially continuous pressure is applied from above. This configuration allows the pins to remain in contact with a level surface (not shown) that is substantially flush with the base 110. The pins typically extend below the upper surface 115 of the base 110 and connect to a wire or electrically conductive member (not shown in this figure).

Figure 4:
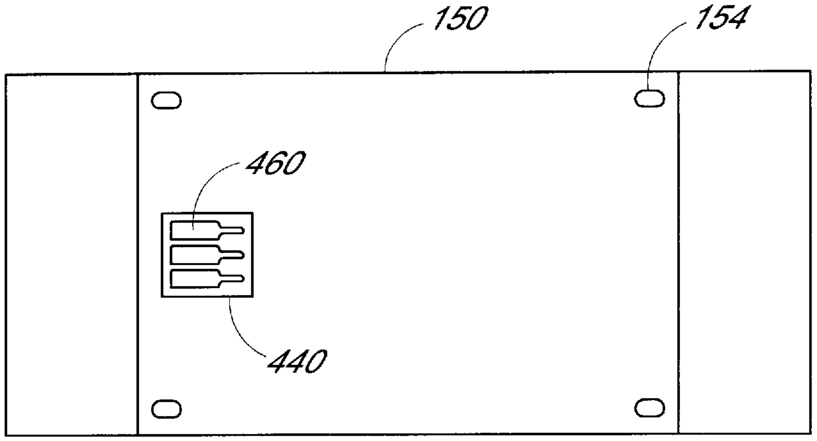
FIG. 4 is a bottom plan view of the keyboard of FIG. 1.

FIG. 4 is a bottom plan view of the keyboard 150. The electrical connector 440 may comprise one or more conductive plates 460 which contact the pins 160 of connector 140 to provide an electrical connection when the keyboard is connected to the base. The plates 460 provide a larger conductive surface area to allow for an extended period of use before wear. For example, one or more of the latches 154 (FIG. 1) may wear down allowing the keyboard 150 to shift slightly when connected to the base 110. Because contact points between the conductive plates 460 and the pins 160 may exist anywhere on the plates 460, the electrical connection between the base 110 and the keyboard 150 remains intact.

Alternatively, the connector 440 may be located on the front, rear or one of the lateral surfaces of the keyboard 150. The location of the connector 440 depends directly on the ability to geometrically align connector 440 to connector 140 when the keyboard 150 is snapped-on to the base 110.

Alternatively, each of the connectors 140 and 440 may be a standard male or female peripheral device connector found on many computers for connecting mice and keyboards. Since most laptop computers are already equipped with this type of connector, it may be cost-effective for manufacturers to add this type of port to the upper surface 115 of the base 110. Alternatively, a port may be artificially added to the upper surface 115 of the base 110 externally by running an electric cord that positions a moveable connector on the upper surface 115 of the base 110.

Figure 5:
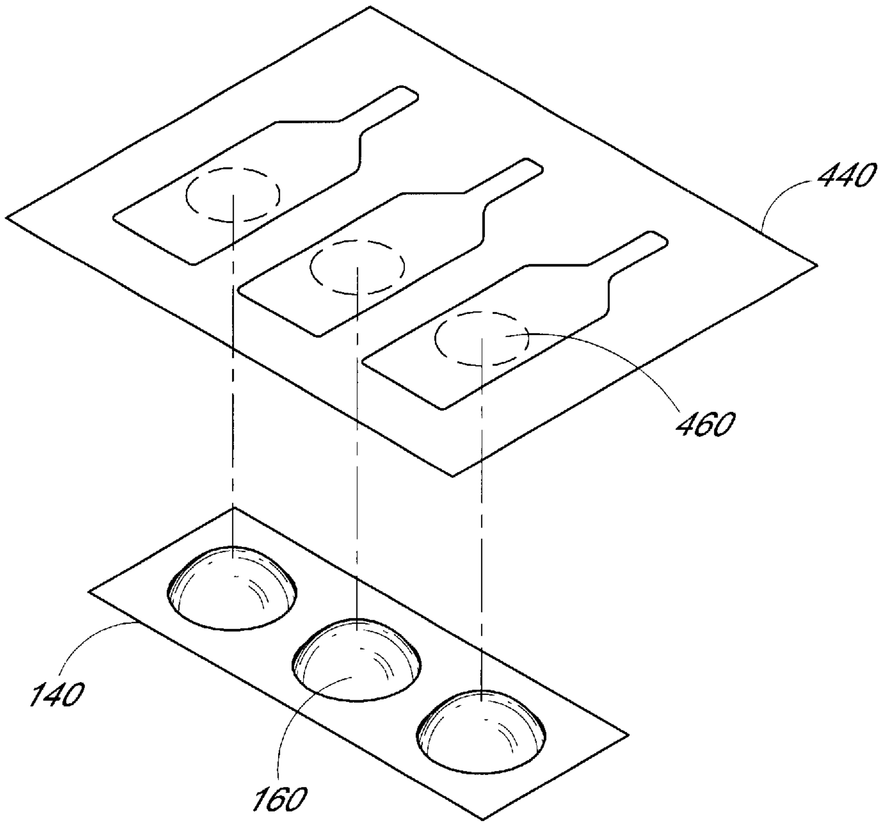
FIG. 5 is a perspective view of the electrical connectors which connect the keyboard to the base of the laptop.

FIG. 5 is a perspective view of connector 140 and connector 440 which are used to electrically connect the keyboard 150 to the base 110 of the portable computer 100. It is desirable to configure the two connectors to automatically form an electrical connection when the user snaps-on the keyboard 150 to the base 110. Alternatively, the user may be required to physically mate the connector 140 with the connector 440 before it is possible to snap-on the keyboard 150 to the base 110.

Upon pressing the one or more keys of the keyboard 150, the electrical signal representative of the key pressed travel from the keyboard 150 through the connectors 440 and 140 into the computer 100. The connectors 140 and 440 may utilize a USB data transfer format without using the standard physical connector associated with a USB format. A USB data transfer format may also supply the keyboard 150 with an electrical power thereby eliminating the need for an additional cord or battery. Additionally, a USB format allows a user to install or remove the keyboard 150 during operation (also known as "hot swapability") without performing a lengthy installation routine. Although a USB connection transfers data in a serial format, the connection allows for much faster data transfer than the standard serial port found on most personal computers.

Alternatively, or in addition to the connectors 140 and 440, the keyboard 150 may contain a retractable cord which is used to connect the keyboard 150 to the computer 100 if the computer 100 is not equipped with a compatible direct connector. Most modern portable computers include a serial port which allows connecting an external keyboard instead of the laptop keyboard. The retractable cord which makes this connection is hidden from view unless used.

Figure 6:
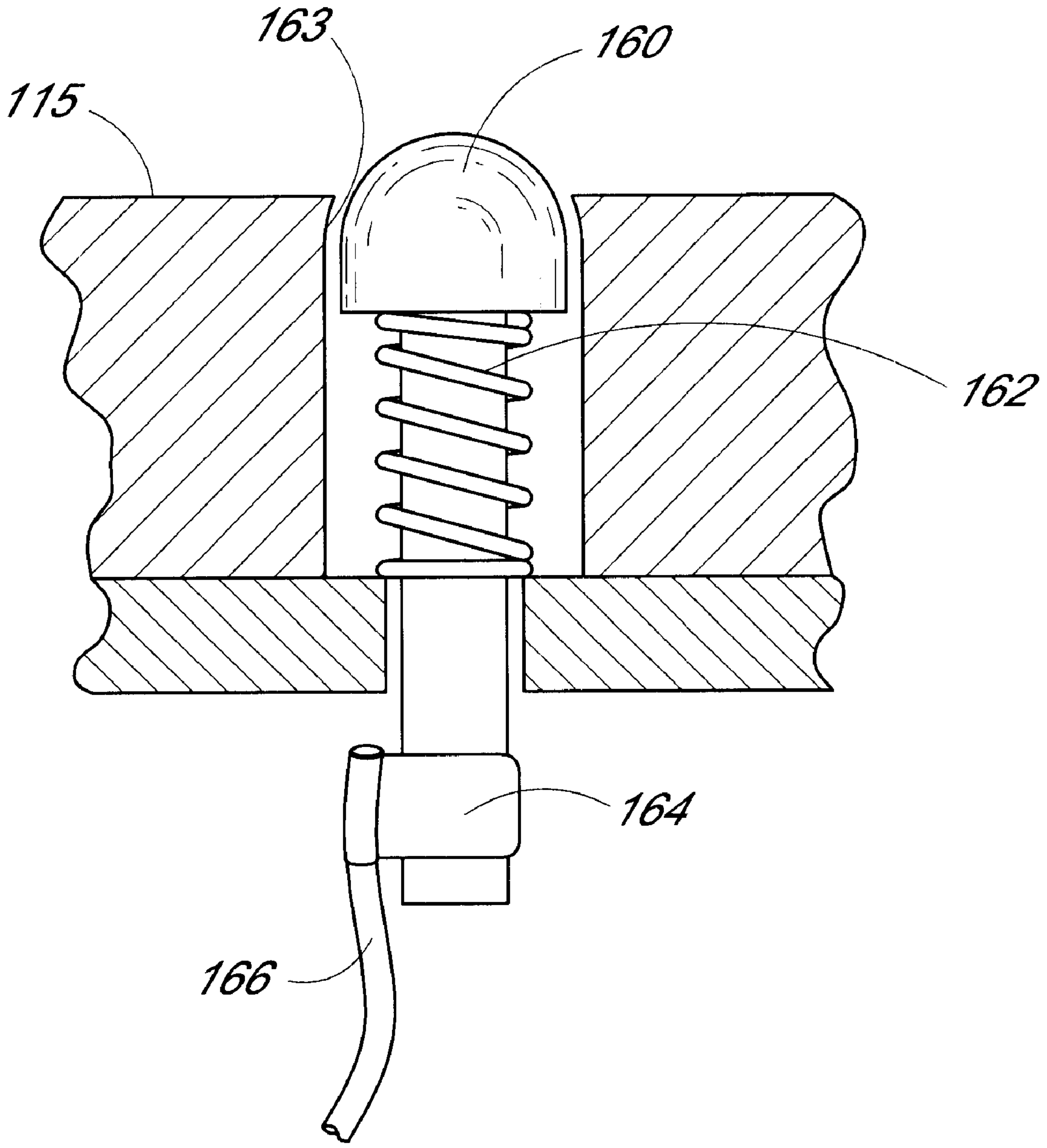
FIG. 6 is a cutaway view of the pin-style electrical connector shown in FIGS. 1, 3 and 5.

FIG. 6 is a cutaway view of the pin style connector shown in FIGS. 1, 3 and 5. The connector comprises a pin 160, a spring 162, an electrical connector 164, and a wire 166. The round upper portion of the pin 160 makes electrical contact with one of the plates of connector 440 shown in FIGS. 4 and 5. The spring 162 exerts an upward force on the pin which causes the pin to extend beyond the upper surface 115 of the base. A housing 163 is formed in the base 110 and provides room for the pin 160 to retract into when a force is applied from above. Although the pin retracts, it maintains electrical contact with the plate connector 440 as the keyboard 150 is latched onto the base 110 of the computer 100.

In view of the foregoing, it will be appreciated that the invention overcomes the long-standing need for providing a conventional keyboard configured to be snapped-on to a portable computer thereby offering the typing comforts of a desktop computer. The invention may be embodied in other specific forms without departing from its spirit or essential characteristics. The described embodiment is to be considered in all respects only illustrative and not restrictive. The scope of the invention is, therefore, indicated by the appended claims rather by the foregoing description. All changes that fall within the meaning and range of equivalency of the claims are to be embraced within their scope.

What is claimed is:

1. A snap-on keyboard configured to operate with a computer having a base with input keys, the snap-on keyboard comprising:

a platform having a plurality of surfaces, and a recess configured to receive the base of the computer;

a set of keys attached to at least one of the plurality of surfaces of the platform and configured to convert mechanical action into electrical signals;

a connector attached to one of the plurality of surfaces of the platform and configured to automatically connect to a receiving connector attached to the computer.

2. The keyboard of claim 1, wherein the connector is configured to provide an electrical interface between the set of keys and the computer.

3. The keyboard of claim 1, wherein the connector is configured to conform to the specification of a Universal Serial Bus (USB) connentor.

4. The keyboard of claim 1, wherein the connector is positioned in a location that is geometrically aligned with the receiving connector.

5. A detachable keyboard for use with a portable computer having a base with input keys and a keyboard connector, the detachable keyboard comprising:

a platform having an upper surface and a lower surface opposite the upper surface, the platform further comprising a recess in the lower surface configured to receive at least a portion of the base of the computer;

a set of keys attached to the upper surface of the platform and configured to convert mechanical force into electrical signals;

an electrical connector coupled to the platform and coupled to receive signals from the set of keys, the connector located on the platform such that it mates with the keyboard connector of the computer when the recess in the lower surface receives at least a portion of the base of the computer.

6. The detachable keyboard of claim 5, further comprising a releasable latch configured to mechanically couple the detachable keyboard to the portable computer.

7. The detachable keyboard of claim 5, further comprising first and second latches located on opposite sides of the platform and configured to mechanically couple the detachable keyboard to the portable computer.

8. The detachable keyboard of claim 5, wherein the electrical connector comprises a plurality of conductive plates.

9. The detachable keyboard of claim 5, wherein the electrical connector comprises a plurality of pins.

10. A computer system comprising:

a computer having a base section which includes an input device;

a first electrical connector located on the base section;

a detachable keyboard comprising a platform having an upper surface and a lower surface opposite the upper surface, the platform further comprising a recess in the lower surface configured to receive at least a portion of the base section, a set of keys attached to the upper surface of the platform and configured to convert mechanical force into electrical signals, a second electrical connector coupled to the platform and coupled to receive signals from the set of keys, the second connector located on the platform such that it mates with the first connector when the recess in the lower surface receives at least a portion of the base of the computer; and a latch mechanism configured to mechanically couple the detachable keyboard and the computer.

11. The computer system comprising of claim 10, wherein the first connector comprises a plurality of pins and the second connector comprises a plurality of contact plates.

12. The computer system comprising of claim 10, wherein the second connector comprises a plurality of pins and the first connector comprises a plurality of contact plates.

* * * * *